US012700837B2

(12) United States Patent
Hirobe

(10) Patent No.: US 12,700,837 B2
(45) Date of Patent: Aug. 4, 2026

(54) RADIO FREQUENCY MODULE AND COMMUNICATION DEVICE

(71) Applicant: Murata Manufacturing Co., Ltd., Kyoto (JP)

(72) Inventor: Masakazu Hirobe, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 511 days.

(21) Appl. No.: 18/319,784

(22) Filed: May 18, 2023

(65) Prior Publication Data

US 2023/0291371 A1     Sep. 14, 2023

Related U.S. Application Data

(63) Continuation of application No. PCT/JP2021/043504, filed on Nov. 26, 2021.

(30) Foreign Application Priority Data

Dec. 2, 2020     (JP) ................................. 2020-200355

(51) Int. Cl.
*H03F 3/24* (2006.01)
*H03F 1/56* (2006.01)

(52) U.S. Cl.
CPC .............. *H03F 3/245* (2013.01); *H03F 1/56* (2013.01); *H03F 2200/171* (2013.01); *H03F 2200/387* (2013.01); *H03F 2200/451* (2013.01)

(58) Field of Classification Search
CPC ...... H03F 3/211; H03F 1/56; H03F 2200/294; H03F 2200/451

(Continued)

(56) References Cited

U.S. PATENT DOCUMENTS

| | | | |
|---|---|---|---|
| 6,188,877 | B1 | 2/2001 | Boesch et al. |
| 2008/0136559 | A1 | 6/2008 | Takahashi et al. |

(Continued)

FOREIGN PATENT DOCUMENTS

| | | |
|---|---|---|
| CN | 110401421 A | 11/2019 |
| CN | 111224626 A | 6/2020 |

(Continued)

OTHER PUBLICATIONS

IoT bands, 2025 (Year: 2025).*
International Search Report for PCT/JP2021/043504 dated Feb. 15, 2022.

*Primary Examiner* — Hafizur Rahman
(74) *Attorney, Agent, or Firm* — McDonald Hopkins LLC

(57) ABSTRACT

A radio frequency module includes a first power amplifier, a second power amplifier, a filter, a switch, and a matching circuit. The first power amplifier outputs a first amplified signal. The second power amplifier outputs a second amplified signal. The filter allows the first amplified signal and the second amplified signal to pass through. The switch has a first terminal and a second terminal. The first terminal is connected to an output portion of the first power amplifier. The second terminal is connected to the filter. The switch changes over connection and disconnection of the first terminal and the second terminal. The matching circuit is connected between an output portion of the second power amplifier and a signal path between the second terminal of the switch and the filter.

10 Claims, 3 Drawing Sheets

(58) Field of Classification Search
USPC ................................................. 330/295, 291
See application file for complete search history.

(56) References Cited

U.S. PATENT DOCUMENTS

| | | | |
|---|---|---|---|
| 2009/0201084 | A1 | 8/2009 | See et al. |
| 2025/0159786 | A1* | 5/2025 | Frenette ................. H03F 1/565 |

FOREIGN PATENT DOCUMENTS

| | | |
|---|---|---|
| JP | 2000-269831 A | 9/2000 |
| JP | 2002-528946 A | 9/2002 |
| JP | 2008-211764 A | 9/2008 |
| JP | 2010-068283 A | 3/2010 |
| JP | 2011-512098 A | 4/2011 |
| JP | 2013026988 A | 2/2013 |

* cited by examiner

RADIO FREQUENCY MODULE AND COMMUNICATION DEVICE

CROSS REFERENCE TO RELATED APPLICATION

This is a continuation of International Application No. PCT/JP2021/043504 filed on Nov. 26, 2021 which claims priority from Japanese Patent Application No. 2020-200355 filed on Dec. 2, 2020. The contents of these applications are incorporated herein by reference in their entireties.

BACKGROUND ART

Technical Field

The present disclosure relates to a radio frequency module and a communication device, and particularly to a radio frequency module including a first power amplifier and a second power amplifier, and a communication device including the radio frequency module.

A transmission circuit (radio frequency module) described in Patent Document 1 includes two switches, a first amplifier, and a second amplifier. A first path and a second path are connected in parallel between the two switches. The second amplifier is connected to the first path. One switch is connected to an antenna and the other switch is connected to a signal input portion via the first amplifier.

In a high-output mode, the first path is selected by using the two switches. With this, a transmission signal inputted to the signal input portion is amplified by the first amplifier and the second amplifier, and is transmitted from the antenna. In a low-output mode, the second path is selected by using the two switches. With this, the transmission signal inputted to the signal input portion is amplified by the first amplifier, and is transmitted from the antenna without necessarily traveling through the second amplifier.

Patent Document 1: Japanese Unexamined Patent Application Publication No. 2010-68283

BRIEF SUMMARY

In the transmission circuit described in Patent Document 1, a transmission signal is transmitted via two switches in the low-output mode. As a result, in the transmission signal in the low-output mode, loss occurs in the two switches. Therefore, it is required to suppress the loss of the transmission signal in the low-output mode. At this time, a leak of a transmission signal in the high-output mode into the second path (signal path for low-output mode) needs to be suppressed.

The present disclosure provides a radio frequency module and a communication device in which loss of an output signal in a low-output mode may be suppressed, and further a leak of an output signal in a high-output mode into a signal path for the low-output mode may also be suppressed.

A radio frequency module according to an aspect of the present disclosure includes a first power amplifier, a second power amplifier, a filter, a switch, and a matching circuit. The first power amplifier amplifies a first signal and outputs a first amplified signal. The second power amplifier amplifies a second signal with an amplification factor smaller than an amplification factor of the first power amplifier and outputs a second amplified signal. The filter allows the first amplified signal and the second amplified signal to pass through. The switch has a first terminal and a second terminal. The first terminal is connected to an output portion of the first power amplifier. The second terminal is connected to the filter. The switch changes over connection and disconnection of the first terminal and the second terminal. The matching circuit is connected between the output portion of the second power amplifier and a signal path that runs between the second terminal of the switch and the filter.

A communication device according to an aspect of the present disclosure includes the radio frequency module and a signal processing circuit. The signal processing circuit is connected to the radio frequency module and processes a radio frequency signal.

According to the present disclosure, there is an effect that loss of an output signal in a low-output mode may be suppressed, and further a leak of an output signal in a high-output mode into a signal path for the low-output mode may also be suppressed.

DETAILED DESCRIPTION

Embodiment 1

(1) Overview

Figure 1:
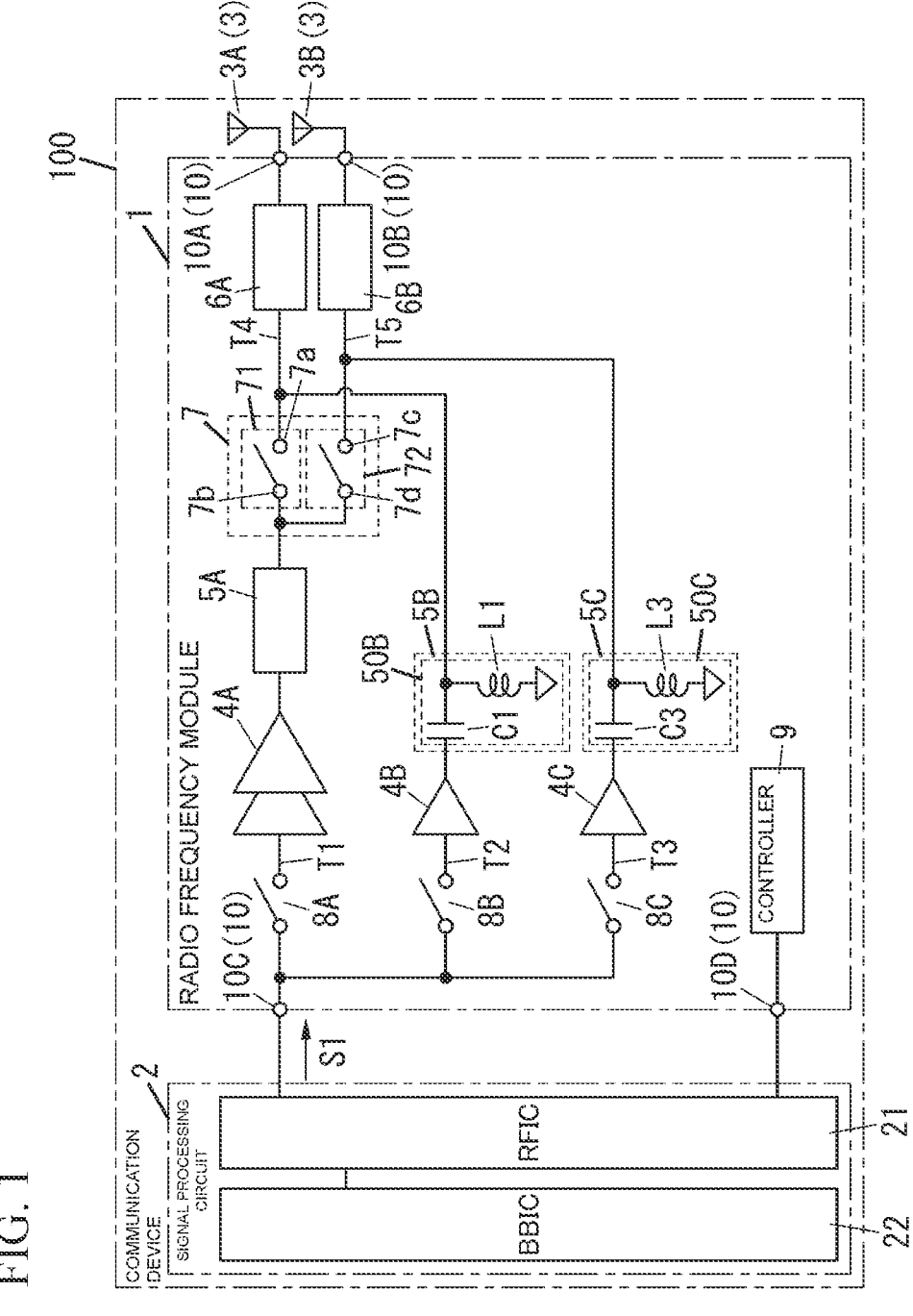
FIG. 1 is a block diagram of a radio frequency module and a communication device according to Embodiment 1.

As illustrated in FIG. 1, a radio frequency module 1 according to Embodiment 1 includes a power amplifier 4A (first power amplifier), a power amplifier 4B (second power amplifier), a filter 6A (first filter), a switch 7, and a matching circuit 5B (first matching circuit). The power amplifier 4A amplifies a transmission signal S1 (first signal) with a first amplification factor and outputs a first amplified signal. The power amplifier 4B amplifies the transmission signal S1 (second signal) with a second amplification factor smaller than the first amplification factor, and outputs a second amplified signal. The filter 6A allows the first amplified signal and the second amplified signal to pass through. The switch 7 has a terminal 7b (first terminal) and a terminal 7a (second terminal). The terminal 7b is a terminal electrically connected to an output portion of the power amplifier 4A. The terminal 7a is a terminal electrically connected to the filter 6A. The filter 6A changes over connection and disconnection of the terminal 7b and the terminal 7a. The matching circuit 5B is connected between an output portion of the power amplifier 4B and a path (part of signal path T4) that runs between the terminal 7a of the switch 7 and the filter 6A.

With the configuration above, loss of the transmission signal S1 (more specifically, the second amplified signal) in a low-output mode (when the terminals 7a and 7b are disconnected) may be suppressed, and a leak of the transmission signal S1 (more specifically, the first amplified signal) in a high-output mode (when the terminals 7a and 7b are connected) into a signal path for the low-output mode (signal path T2 provided with the power amplifier 4B) may be suppressed.

(2) Detailed Description

Hereinafter, the radio frequency module 1 and a communication device 100 according to Embodiment 1 will be described in detail with reference to FIG. 1.

(2-1) Configuration of Communication Device

As illustrated in FIG. 1, the communication device 100 is a communication device that includes the radio frequency module 1. The communication device 100 is a mobile terminal (a smartphone, for example), but is not limited thereto, and may be a wearable terminal (a smart watch, for example), for example. The radio frequency module 1 is a module compatible with the 4G (fourth generation mobile communication) standard and the 5G (fifth generation mobile communication) standard, for example. The 4G standard is the 3GPP Long Term Evolution (LTE) standard, for example. The 5G standard is 5G New Radio (NR), for example. The radio frequency module 1 is a module capable of supporting Carrier Aggregation and Dual Connectivity.

The communication device 100 includes a signal processing circuit 2 and one or more (two, for example) antennas 3 (3A and 3B) in addition to the radio frequency module 1.

The radio frequency module 1 is configured to amplify a transmission signal (radio frequency signal) outputted from the signal processing circuit 2 and to transmit an amplified signal from the antenna 3. More specifically, the radio frequency module 1 has a high-output mode and a low-output mode. The high-output mode is a mode in which a transmission signal is amplified with the first amplification factor and is transmitted from the antenna 3. The low-output mode is a mode in which a transmission signal is amplified with the second amplification factor smaller than the first amplification factor and is transmitted from the antenna 3. The radio frequency module 1 is controlled by the signal processing circuit 2, for example.

The signal processing circuit 2 is connected to the radio frequency module 1, and is configured to perform signal processing on a transmission signal to be outputted to the radio frequency module 1. The signal processing circuit 2 includes an RF signal processing circuit 21 and a baseband signal processing circuit 22. The baseband signal processing circuit 22 is a baseband integrated circuit (BBIC), for example. The baseband signal processing circuit 22 generates a transmission signal from a baseband signal (an audio signal and an image signal, for example) inputted from the outside, and outputs a generated transmission signal to the RF signal processing circuit 21. The RF signal processing circuit 21 is a radio frequency integrated circuit (RFIC), for example, and performs signal processing on a radio frequency signal (transmission signal). The RF signal processing circuit 21 performs signal processing such as up-conversion on a transmission signal outputted from the baseband signal processing circuit 22, and outputs the transmission signal subjected to the signal processing to the radio frequency module 1, for example.

In the present embodiment, the radio frequency module 1 performs only transmission of a transmission signal out of transmission of a transmission signal and reception of a reception signal, using the antenna 3. Whereas the radio frequency module 1 may receive a reception signal using the antenna 3. In the case above, the radio frequency module 1 is further configured to amplify the reception signal received by the antenna 3 and to output the amplified reception signal to the signal processing circuit 2. In the case above, the signal processing circuit 2 is further configured to perform signal processing on the reception signal outputted from the radio frequency module 1 to the signal processing circuit 2. More specifically, the RF signal processing circuit 21 of the signal processing circuit 2 further performs signal processing such as down-conversion on the reception signal outputted from the radio frequency module 1 to the signal processing circuit 2, and outputs the reception signal subjected to the signal processing to the baseband signal processing circuit 22. Further, the baseband signal processing circuit 22 of the signal processing circuit 2 outputs the reception signal received from the RF signal processing circuit 21 to the outside. The output signal (reception signal) is used as an image signal for image display or as an audio signal for a call, for example.

(2-2) Circuit Configuration of Radio Frequency Module

As illustrated in FIG. 1, in the radio frequency module 1, output portions of multiple (three in the illustrated example) power amplifiers 4A to 4C are connected to transmission filters 6A and 6B using the switch 7. Then, a power amplifier used for transmission of the transmission signal S1 is selected by using the switch 7 from the multiple power amplifiers 4A to 4C. With this, the transmission signal S1 amplified by the multiple power amplifiers 4A to 4C is outputted to the transmission filters 6A and 6B, and is transmitted from the antennas 3A and 3B. In the radio frequency module 1, it is contrived to suppress the loss of the transmission signal S1 caused by the switch 7 in the low-output mode in which the transmission signal S1 is amplified by the power amplifier 4B or 4C and is transmitted. Further, it is contrived to suppress a leak of the transmission signal S1 in the high-output mode, which is amplified by the power amplifier 4A and transmitted, into signal paths T2 and T3 (that is, the signal paths in which the power amplifiers 4B and 4C are provided) for the low-output mode.

Hereinafter, a circuit configuration of the radio frequency module 1 will be described in detail. In the following description, there will be exemplified a circuit configuration in which a band select switch is used as the switch 7 and the transmission signal S1 is transmitted in a frequency division duplex (FDD).

As illustrated in FIG. 1, the radio frequency module 1 transfers a radio frequency signal (transmission signal, for example) between the antennas 3A and 3B, and the signal processing circuit 2.

The radio frequency module 1 includes the multiple (three in the illustrated example) power amplifiers 4A to 4C, multiple (three in the illustrated example) matching circuits 5A to 5C, the multiple (two in the illustrated example) transmission filters 6A and 6B, the switch 7, multiple (three in the illustrated example) switches 8A to 8C, a controller 9, and outer connection terminals 10 (10A to 10D). Further, the radio frequency module 1 includes multiple (five in the illustrated example) signal paths T1 to T5.

The multiple outer connection terminals 10 include the antenna terminals 10A and 10B, the signal input terminal 10C, and the input terminal 10D. The antenna terminals 10A and 10B are terminals to which the antennas 3A and 3B are connected, respectively. The signal input terminal 10C is a terminal to which a transmission signal from the signal processing circuit 2 is inputted, and is connected to an output portion of the signal processing circuit 2. The input terminal 10D is a terminal to which a control signal from the signal processing circuit 2 is inputted, and is connected to the output portion of the signal processing circuit 2.

The signal path T1 is a path between the signal input terminal 10C and the terminals 7b and 7d of the switch 7. The signal path T1 includes the switch 8A, the power amplifier 4A, and the matching circuit 5A. The signal path T4 is a path between the terminal 7a of the switch 7 and the antenna terminal 10A. The signal path T4 is provided with the transmission filter 6A. The signal path T5 is a path between the terminal 7c of the switch 7 and the antenna terminal 10B. The signal path T5 is provided with the transmission filter 6B. The signal path T2 is a path between the signal input terminal 10C and a signal path (part of signal path T4) that runs between the terminal 7a of the switch 7 and the transmission filter 6A. The signal path T2 is provided with the switch 8B, the power amplifier 4B, and the matching circuit 5B. The signal path T3 is a path between the signal input terminal 10C and a signal path (part of signal path T5) that runs between the terminal 7c of the switch 7 and the transmission filter 6B. The signal path T3 is provided with the switch 8C, the power amplifier 4C, and the matching circuit 5C.

In the radio frequency module 1, the switch 7 is not provided in a signal path between the output portion of the power amplifier 4B and the transmission filter 6A (part of signal path T2 and part of signal path T4). Further, the switch 7 is not provided in a signal path (part of signal path T3 and part of signal path T5) between an output portion of the power amplifier 4C and the transmission filter 6B.

The switches 8A to 8C are provided in the signal paths T1 to T3, respectively, and are controlled to change over on and off by a control signal from the controller 9. Thus, the signal paths T1 to T3 each is electrically connected and disconnected. A signal path to be used for the transmission of the transmission signal S1 is selected from the multiple signal paths T1 to T3 by using the switches 8A to 8C. The switches 8A to 8C each is a switch integrated circuit (IC), for example. Each of one end portions of the switches 8A to 8C is connected to the signal input terminal 10C, and the other end portions of the switches 8A to 8C are connected to respective input portions of the power amplifiers 4A to 4C.

The power amplifiers 4A to 4C are provided in the signal paths T1 to T3, respectively, and each amplify the transmission signal S1 flowing through the signal paths T1 to T3. The power amplifier 4A has the first amplification factor as an amplification factor for amplifying the transmission signal S1. The power amplifier 4B has the second amplification factor smaller than the first amplification factor as an amplification factor for amplifying the transmission signal S1. The power amplifier 4C has a third amplification factor smaller than the first amplification factor as an amplification factor for amplifying the transmission signal S1. In the present embodiment, the second amplification factor and the third amplification factor are amplification factors the same as each other, but may be amplification factors different from each other.

Each of the power amplifiers 4A to 4C has the input portion and the output portion. The input portions of the power amplifiers 4A to 4C are connected to end portions of the switches 8A to 8C, respectively, and the output portions of the power amplifiers 4A to 4C are connected to input portions of the matching circuits 5A to 5C, respectively. The power amplifier 4A amplifies a transmission signal inputted to the input portion with the first amplification factor and outputs the first amplified signal from the output portion. The power amplifier 4B amplifies a transmission signal inputted to the input portion with the second amplification factor and outputs the second amplified signal from the output portion. The power amplifier 4C amplifies a transmission signal inputted to the input portion with the third amplification factor and outputs a third amplified signal from the output portion. Each of the power amplifiers 4A to 4C is controlled by a control signal from the controller 9. That is, in each of the power amplifiers 4A to 4C, a power supply is changed over on and off by a control signal from the controller 9. By the changing over above, a bias current of each of the power amplifiers 4A to 4C is changed over on and off.

The matching circuit 5A is a circuit for impedance matching of the power amplifier 4A and the switch 7. The matching circuit 5A is connected to a signal path (part of signal path T1) between the power amplifier 4A and the switch 7. The matching circuit 5B is a circuit for impedance matching of the power amplifier 4B and the transmission filter 6A. Being provided in the signal path T2, the matching circuit 5B is connected to a signal path between the power amplifier 4B and the transmission filter 6A. In other words, the matching circuit 5B is connected between the output portion of the power amplifier 4B and the signal path (part of signal path T4) that runs between the terminal 7a of the switch 7 and the transmission filter 6A. The matching circuit 5C is a circuit for impedance matching of the power amplifier 4C and the transmission filter 6B. Being provided in the signal path T3, the matching circuit 5C is connected between the power amplifier 4C and the transmission filter 6B. In other words, the matching circuit 5C is connected between the output portion of the power amplifier 4C and the signal path (part of signal path T5) that runs between the terminal 7c of the switch 7 and the transmission filter 6B.

The switch 7 is a switch (band select switch) for selecting a transmission filter to be used for transmission of the transmission signal S1 from the two transmission filters 6A and 6B. The switch 7 is a switch integrated circuit (IC), for example. The switch 7 has two sets of terminals (a set of terminals 7a and 7b (first set) and a set of terminals 7c and 7d (second set)). The first set of terminals 7a and 7b are electrically connected to and disconnected from each other. The second set of terminals 7c and 7d are electrically connected to and disconnected from each other. Being connected to the signal path T1, the terminals 7b and 7d each is connected to the output portion of the matching circuit 5A. Being connected to the signal path T4, the terminal 7a is connected to the transmission filter 6A. Being connected to the signal path T5, the terminal 7c is connected to the transmission filter 6B.

The switch 7 includes multiple (two in the illustrated example) internal switches 71 and 72. The internal switch 71 is a switch to change over selection and non-selection of the transmission filter 6A by changing over on and off. The internal switch 72 is a switch to change over selection and non-selection of the transmission filter 6B by changing over on and off. The internal switch 71 is configured of the terminals 7a and 7b, and is changed over on and off by connection and disconnection of the terminals 7a and 7b. The internal switch 72 is configured of the terminals 7c and 7d, and is changed over on and off by connection and disconnection of the terminals 7c and 7d.

The transmission filters 6A and 6B are provided in the signal paths T4 and T5, respectively. The transmission filters 6A and 6B are filters whose pass bands are transmission bands (communication bands) of communication bands (first and second communication bands, for example) different from each other. The transmission filter 6A allows the amplified signals (first amplified signal and second amplified signal) of the power amplifiers 4A and 4B to pass through. The transmission filter 6B allows the amplified signals (first amplified signal and third amplified signal) of the power amplifiers 4A and 4C to pass through. The transmission filters 6A and 6B each has the input portion and the output portion. The input portions of the transmission filters 6A and 6B are connected to the terminals 7a and 7c of the switch 7, respectively. The output portions of the transmission filters 6A and 6B are connected to the antenna terminals 10A and 10B, respectively. The transmission filters 6A and 6B respectively restrict reception signals inputted to the input portions to signals in the transmission bands of the first and second communication bands, and output the signals from the output portions.

Each of the transmission filters 6A and 6B is an acoustic wave filter, for example. The acoustic wave filter is a surface acoustic wave (SAW) filter using a surface acoustic wave, for example. Note that each of the transmission filters 6A and 6B is not limited to the SAW filter and may be a bulk acoustic wave (BAW) filter, for example, other than the SAW filter.

The controller 9 is a control device that controls electronic components (power amplifiers 4A to 4C, matching circuits 5A to 5C, transmission filters 6A and 6B, switch 7, and switches 8A to 8C) in accordance with a control signal from the signal processing circuit 2. The controller 9 is electrically connected to the electronic components described above. Further, the controller 9 is connected to the output portion of the signal processing circuit 2 via the input terminal 10D. The controller 9 controls the electronic components described above in accordance with a control signal inputted to the input terminal 10D from the signal processing circuit 2.

(2-3) Operation of Communication Device

The operation of the communication device 100 will be described with reference to FIG. 1.

The communication device 100 has the high-output mode and the low-output mode. The high-output mode is a mode in which the transmission signal S1 is amplified by the power amplifier 4A and transmitted. The low-output mode is a mode in which a transmission signal is amplified by the power amplifier 4B or 4C and transmitted. Further, in the communication device 100, a transmission filter to be used at the time of transmission may be selected from the multiple transmission filters 6A and 6B. In the following description, as an example, there will be described an operation in a case that the transmission signal S1 is transmitted using the two transmission filters 6A and 6B in each of the high-output mode and the low-output mode.

First, there will be described an operation in which the transmission signal S1 is transmitted using the transmission filters 6A and 6B in the high-output mode. In the case above, both the internal switches 71 and 72 are turned on. With this, the transmission filters 6A and 6B are selected. Further, the switch 8A is turned on, and the switches 8B and 8C are turned off. Further, the power supply of the power amplifier 4A is turned on, and the power supplies of the power amplifiers 4B and 4C are turned off.

In the state above, when the transmission signal S1 is inputted from the signal processing circuit 2 to the signal input terminal 10C, the transmission signal S1 flows through the signal path T1, the internal switch 71, and the signal path T4, and is transmitted from the antenna 3A. Further, the transmission signal S1 flows through the signal path T1, the internal switch 72, and the signal path T5, and is transmitted from the antenna 3B. At this time, the transmission signal S1 is processed in each of the power amplifier 4A and the matching circuit 5A, when flowing through the signal path T1. Further, the transmission signal S1 is processed in each of the transmission filters 6A and 6B, when flowing through the signal paths T4 and T5.

Since the transmission signal S1 in the high-output mode is transmitted via the switch 7, loss occurs in the switch 7. Note that, when the switch 7 is an existing switch, the loss of the transmission signal S1 in the high-output mode in the switch 7 is not a new loss. Therefore, the electric power of the transmission signal S1 in the high-output mode is maintained even when the loss occurs in the switch 7. Accordingly, in the transmission signal in the high-output mode, an increase in electric power due to the loss in the switch 7 is suppressed.

In the high-output mode, there may occur inflow of the transmission signal S1 flowing through the signal path T1 (signal path for high-output mode), from the signal path T1 to the signal path T2 (signal path for low-output mode) electrically connected to the terminal 7a of the switch 7. However, the inflow above is suppressed by the matching circuit 5B provided in the signal path T2. More specifically, as will be described later, the matching circuit 5B is configured such that impedance of the matching circuit 5B appears to be infinite (also referred to as open) when viewed from a side of the signal path T1 for the high-output mode. Thus, the inflow of the transmission signal S1 from the signal path T1 to the signal path T2 is suppressed by the matching circuit 5B.

Further, in the high-output mode, the power supply of the power amplifier 4B is turned off (that is, the bias current of the power amplifier 4B is zero). With this, when viewed from the side of the signal path T1 for the high-output mode, the impedance of the matching circuit 5B appears to be more infinite. As a result, the inflow of the transmission signal S1 from the signal path T1 to the signal path T2 is further suppressed by the matching circuit 5B.

Similarly, in the high-output mode, there may occur inflow of the transmission signal S1 flowing through the signal path T1 (signal path for high-output mode), from the signal path T1 to the signal path T3 (signal path for low-output mode) electrically connected to the terminal 7c of the internal switch 72. In the case above, the inflow is suppressed by the matching circuit 5C provided in the signal path T3. More specifically, as will be described later, the matching circuit 5C is configured such that impedance of the matching circuit 5C appears to be infinite when viewed from the side of the signal path T1 for the high-output mode (that is, a side of the internal switch 72). Thus, the inflow of the transmission signal S1 from the signal path T1 to the signal path T3 is suppressed by the matching circuit 5C.

Further, in the high-output mode, the power supply of the power amplifier 4C is turned off (that is, the bias current of the power amplifier 4C is turned off). With this, when viewed from the side of the signal path T1 for the high-output mode, the impedance of the matching circuit 5C appears to be more infinite. As a result, the inflow of the transmission signal S1 from the signal path T1 to the signal path T3 is further suppressed by the matching circuit 5C.

Next, there will be described an operation in which the transmission signal S1 is transmitted using the transmission filters 6A and 6B in the low-output mode. In the case above, both the internal switches 71 and 72 are turned off. Further, both the switches 8B and 8C are turned on. With this, the transmission filters 6A and 6B are selected. Further, the switch 8A is turned off. Further, both the power supplies of the power amplifiers 4B and 4C are turned on, and the power supply of the power amplifier 4A is turned off.

In the state above, when the transmission signal S1 is inputted from the signal processing circuit 2 to the signal input terminal 10C, the transmission signal S1 is transmitted from the antenna 3A via the signal paths T2 and T4, and is transmitted from the antenna 3B via the signal paths T3 and T5. At this time, the transmission signal S1 is processed in each of the power amplifier 4B, the matching circuit 5B, and the transmission filter 6A, when flowing through the signal paths T2 and T4. Further, the transmission signal S1 is processed in each of the power amplifier 4C, the matching circuit 5C, and the transmission filter 6B, when flowing through the signal paths T3 and T5.

In the low-output mode, since the transmission signal S1 flowing through the signal paths T2 and T4 does not pass through the switch 7, the loss caused by passing through the switch 7 does not occur. Thus, in the low-output mode, the transmission signal S1 flowing through the signal paths T2 and T4 is transmitted from the antenna 3A with the loss in the switch 7 being suppressed.

Similarly, in the low-output mode, since the transmission signal S1 flowing through the signal paths T3 and T5 does not pass through the switch 7, the loss caused by passing through the switch 7 does not occur. Thus, in the low-output mode, the transmission signal S1 flowing through the signal paths T3 and T5 is transmitted from the antenna 3B with the loss in the switch 7 being suppressed.

Since the transmission signal S1 in the low-output mode is amplified by the power amplifiers 4B and 4C, the electric power (power) of the transmission signal S1 is smaller than the electric power of the transmission signal S1 in the high-output mode. Therefore, as described above, it is effective to transmit the transmission signal S1 in the low-output mode with the loss in the switch 7 being suppressed.

As described above, in the communication device 100, there may be suppressed the loss of the transmission signal S1 in the low-output mode, and there may also be suppressed a leak of the transmission signal S1 in the high-output mode from the signal path T1 for the high-output mode to the signal paths T2 and T3 for the low-output mode.

(2-4) Configuration of Matching Circuit

In the present embodiment, as described above, the matching circuits 5B and 5C are configured such that the impedance of each of the matching circuits 5B and 5C appears to be infinite when viewed from signal path T1 for a high-output. In other words, the matching circuits 5B and 5C are respectively configured to allow the output signals (second amplified signal and third amplified signal) of the power amplifiers 4B and 4C to pass through, but not to allow the output signal (first amplified signal) of the power amplifier 4A having leaked from the signal path T1 to the signal paths T2 and T3 to pass through.

Hereinafter, matching circuits 5B and 5C above will be described in detail with reference to FIG. 1. However, since the matching circuits 5B and 5C have the same configuration, in the following description, the configuration of the matching circuit 5B will mainly be described. A description of the configuration of the matching circuit 5C will be omitted, denoting the same reference signs with the matching circuit 5B to portions of the same configuration.

The matching circuit 5B is configured to allow an output signal (second amplified signal) of the power amplifier 4B to pass through. More specifically, a cutoff frequency of the matching circuit 5B is set to be lower than a frequency of an output signal of the power amplifier 4B. In other words, a passing frequency of the matching circuit 5B is set to overlap with the frequency of the output signal of the power amplifier 4B. With this, the output signal of the power amplifier 4B is able to pass through the matching circuit 5B. Note that the cutoff frequency of the matching circuit 5B is a frequency that the matching circuit 5B blocks to pass through. Further, the passing frequency of the matching circuit 5B is a frequency that the matching circuit 5B allows to pass through.

Further, the matching circuit 5B is configured such that the impedance of the matching circuit 5B appears to be infinite when viewed from the side of the signal path T1 for the high-output mode. More specifically, the matching circuit 5B includes a high pass filter 50B. The high pass filter 50B includes a capacitor C1 and an inductor L1, for example.

The capacitor C1 is a series capacitor (hereinafter, also referred to as a series capacitor C1), and is connected in series with the power amplifier 4B on a signal path between the output portion of the power amplifier 4B and the terminal 7a of the switch 7. The inductor L1 is a shunt inductor (hereinafter, also referred to as a shunt inductor L1), and is connected between the signal path T2 and a ground. With the configuration above, the high pass filter 50B may be configured with a simple configuration. Note that, in the illustrated example of FIG. 1, the capacitor C1 is disposed closer to the power amplifier 4B than the inductor L1. Since the matching circuit 5B includes the high pass filter 50B, the impedance of the matching circuit 5B appears to be infinite when viewed from the signal path T1 on a high-output side.

More specifically, in the matching circuit 5B, the high pass filter 50B is provided in final processing (final stage) among one or more (one in the present embodiment) processing (processing stages), which processes an output signal of the power amplifier 4B inputted from the input portion and outputs a processed signal from the output portion. That is, the high pass filter 50B serves as a first processing portion (input stage) in the matching circuit 5A for a transmission signal that has leaked from the signal path T1 to the signal path T2. With this, because of the impedance of the high pass filter 50B, the impedance of the matching circuit 5B appears to be more infinite when viewed from the side of the signal path T1 for the high-output mode.

Similar to the matching circuit 5B, the matching circuit 5C includes a high pass filter 50C. The high pass filter 50C includes a capacitor C3 and an inductor L3, for example. The capacitor C3 is a series capacitor (hereinafter, also referred to as a series capacitor C3), and is connected in series with the power amplifier 4C on a signal path between the output portion of the power amplifier 4C and the terminal 7c of the switch 7. The inductor L3 is a shunt inductor (hereinafter, also referred to as a shunt inductor L3), and is connected between the signal path T3 and the ground.

Next, there will be described the reason why the impedance of the matching circuit 5B may be made to appear to be infinite when the matching circuit 5B includes the high pass filter 50B, with reference to the Smith chart illustrated in FIG. 2. The Smith chart is a graph expressing a reflection coefficient Γ corresponding to impedance Z (of the matching circuit 5B). The reflection coefficient Γ is given by Equation 1 using the impedance Z. Note that, Z0 is a characteristic impedance (reference impedance). Accordingly, since the impedance Z is a complex number, the reflection coefficient Γ is also a complex number.

$$\Gamma = (Z - Z0)/(Z + Z0) \qquad \text{Equation 1}$$

Figure 2:
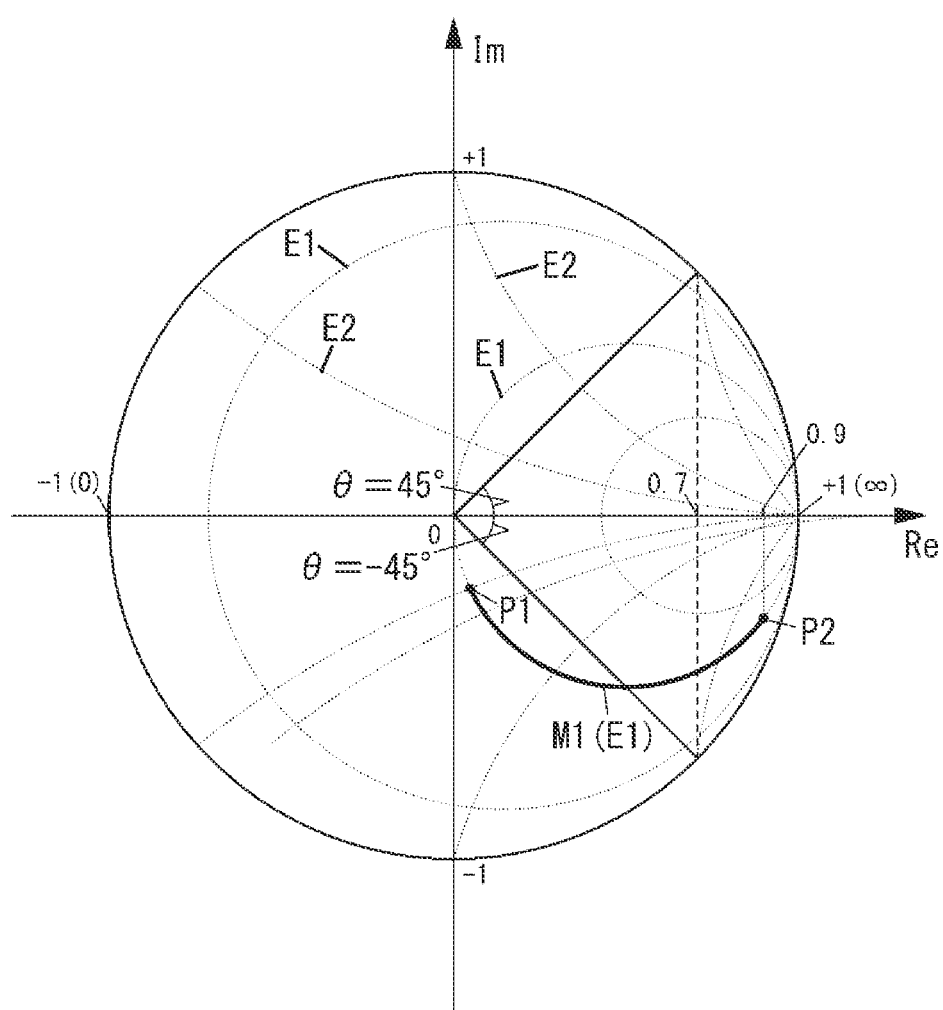
FIG. 2 is an explanatory diagram for explaining impedance of a matching circuit.

As illustrated in FIG. 2, the Smith chart is defined by a constant resistance circle E1 and a constant reactance circle E2. The constant resistance circle E1 is a circle in which the real part of the impedance Z takes a constant value. The constant reactance circle E2 is an arc in which the imaginary part of the impedance Z takes a constant value.

In the Smith chart of FIG. 2, as an example, the reflection coefficient Γ is normalized to fall within a unit circle having a radius of 1. Further, in FIG. 2, a center of the unit circle is set as an origin, the vertical axis passing through the origin represents the imaginary part (Im) of the reflection coefficient Γ, and the horizontal axis passing through the origin represents the real part (Re) of the reflection coefficient Γ. Further, in FIG. 2, +1 (Γ=Re(+1)) on the horizontal axis corresponds to infinity of the impedance Z of the matching circuit 5B, and −1 (Γ=Re(−1)) on the horizontal axis corresponds to zero (also referred to as short) of the impedance Z of the matching circuit 5B.

Considered is a case that the reflection coefficient Γ corresponding to the impedance Z (that is the impedance of the inductor L1) of the matching circuit 5B is present at a point P1 in the Smith chart illustrated in FIG. 2, when the matching circuit 5B has only the inductor L1 illustrated in FIG. 1 as a circuit configuration. As the point P1 is closer to +1 on the horizontal axis of the Smith chart, the impedance Z of the matching circuit 5B appears to be infinite when viewed from the signal path T1 for the high-output mode.

Then, considered is a case that the point P1 is moved to a point P2. The point P2 is a point close to +1 on the horizontal axis of the Smith chart, and is an example of a point at which the impedance Z may appear to be infinite. As illustrated in FIG. 2, the point P1 may be moved to the point P2 by moving counterclockwise along a certain constant resistance circle M1 (E1), for example. According to the calculation method using the Smith chart, the circuit configuration having the impedance Z corresponding to the point P2 is a configuration in which the capacitor C1 is added in series to the inductor L1 (that is, a configuration in which the capacitor C1 is added in series to the signal path T2) in the circuit configuration having the impedance Z corresponding to the point P1 (that is, the configuration having only the inductor L1 in FIG. 1). That is, the circuit configuration having the impedance Z corresponding to the point P2 is the circuit configuration of the inductor L1 and the capacitor C1 illustrated in FIG. 1 (that is, the circuit configuration of the high pass filter 50B). Since the matching circuit 5B includes the high pass filter 50B (that is, the inductor L1 and the capacitor C1) as described above, it is possible to make the impedance Z of the matching circuit 5B appear to be infinite.

In order to make the impedance Z of the matching circuit 5B appear to be infinite when viewed from the side of the signal path T1 for the high-output mode, it is desirable that the real part (Re) of the reflection coefficient Γ corresponding to the impedance Z of the matching circuit 5B take +1 in the Smith chart of FIG. 2. However, the real part (Re) of the reflection coefficient Γ is not limited to take +1. For example, it is sufficient that the real part of the reflection coefficient Γ is a value of 0.7 or more and 1 or less, and can be a value of 0.8 or more and 1 or less (that is, a value within a range of 0.9±0.1).

Further, a phase angle, when the reflection coefficient Γ corresponding to the impedance Z of the matching circuit 5B is expressed in polar coordinates, is denoted as θ. In order to make the impedance Z of the matching circuit 5B appear to be infinite when viewed from the side of the signal path T1 for the high-output mode, it is sufficient that the phase angle θ of the reflection coefficient Γ is in a range of −45 degrees or more and 45 degrees in the Smith chart of FIG.

2. The range above corresponds to a range in which the real part of the reflection coefficient Γ is 0.7 or more and 1 or less.

(3) Main Effects

The radio frequency module 1 of the present embodiment includes the power amplifier 4A (first power amplifier), the power amplifier 4B (second power amplifier), the transmission filter 6A (first filter), the switch 7, and the matching circuit 5B (first matching circuit). The power amplifier 4A amplifies the transmission signal S1 (first signal) with the first amplification factor and outputs the first amplified signal. The power amplifier 4B amplifies the transmission signal S1 (second signal) with the second amplification factor smaller than the first amplification factor and outputs the second amplified signal. The transmission filter 6A allows the first amplified signal and the second amplified signal to pass through. The switch 7 includes the terminal 7b (first terminal) and the terminal 7a (second terminal). The terminal 7b is a terminal electrically connected to the output portion of the power amplifier 4A. The terminal 7a is a terminal electrically connected to the transmission filter 6A. The transmission filter 6A changes over connection and disconnection of the terminal 7b and the terminal 7a. The matching circuit 5B is connected between the output portion of the power amplifier 4B and the path (part of signal path T4) that runs between the terminal 7a of the switch 7 and the filter 6A.

With the use of the configuration above, there may be suppressed a leak of the transmission signal S1 (more specifically, first amplified signal) in the high-output mode from the signal path T1 (signal path provided with the power amplifier 4A) into the signal path T2 (signal path provided with the power amplifier 4B), and there may be suppressed the loss of the transmission signal S1 (more specifically, second amplified signal) in the low-output mode. More specifically, since the output portion of the power amplifier 4B is electrically connected to the terminal 7a of the switch 7, the transmission signal S1 in the low-output mode may be outputted to the filter 6A without necessarily passing through the switch 7. With this, the loss of the transmission signal S1 in the switch 7 in the low-output mode may be suppressed. Further, the matching circuit 5B is connected between the power amplifier 4B and the signal path (part of signal path T4) that runs between the terminal 7a of the switch 7 and the transmission filter 6A. With the matching circuit 5B, a leak of the transmission signal S1 in the high-output mode from the signal path T1 into the signal path T2 may be suppressed.

Furthermore, the radio frequency module 1 includes the power amplifier 4C (third power amplifier), the transmission filter 6B (second transmission filter), and the matching circuit 5C (third matching circuit). The power amplifier 4C amplifies the transmission signal S1 (third signal) with the third amplification factor smaller than the first amplification factor and outputs the third amplified signal. The transmission filter 6B allows the first amplified signal and the third amplified signal to pass through. The switch 7 further includes the terminal 7c (third terminal) electrically connected to the transmission filter 6B. The switch 7 changes over connection and disconnection of the terminal 7d (first terminal) and the terminal 7c (third terminal). The matching circuit 5C is connected between the output portion of the power amplifier 4C and the signal path (part of signal path T5) that runs between the terminal 7c of the switch 7 and the transmission filter 6B.

With the use of the configuration above, it is possible to add another signal path T3 of the low-output mode that outputs the third amplified signal of the power amplifier 4C to the transmission filter 6B via the matching circuit 5C. Then, in the case above as well, there may be suppressed a leak of the transmission signal S1 (more specifically, first amplified signal) in the high-output mode into another signal path T3 for the low-output mode, and there may be suppressed the loss of the transmission signal S1 (more specifically, third amplified signal) in the low-output mode. More specifically, since the output portion of the power amplifier 4C is electrically connected to the terminal 7c of the switch 7, the transmission signal S1 (more specifically, third amplified signal) in the low-output mode may be outputted to the transmission filter 6B without necessarily passing through the switch 7. With this, it is possible to suppress the loss of the transmission signal S1 (third amplified signal) in the low-output mode in the switch 7. Further, with the matching circuit 5C, a leak of the transmission signal S1 in the high-output mode from the signal path T1 into the signal path T3 may be suppressed.

(4) Modification

A modification of Embodiment 1 will be described.

Figure 3:
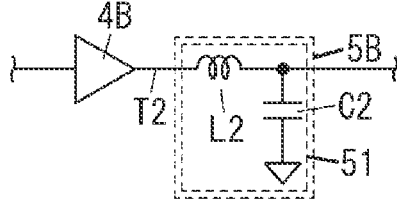
FIG. 3 is a circuit configuration diagram of a matching circuit of Modification 1 of Embodiment 1.

In Embodiment 1, a case that the matching circuit 5B includes the series capacitor C1 and the shunt inductor L1 (that is, the high pass filter 50B) is exemplified. However, as illustrated in FIG. 3, the matching circuit 5B may include an inductor L2 and a capacitor C2 (that is, a low pass filter 51) instead of the series capacitor C1 and the shunt inductor L1.

The inductor L2 is a series inductor (hereinafter, also referred to as series inductor L2), and is connected in series with the power amplifier 4B in the signal path between the output portion of the power amplifier 4B and the terminal 7a of the switch 7. The capacitor C2 is a shunt capacitor (hereinafter, also referred to as shunt capacitor C2), and is connected between the signal path T2 and the ground. Note that, in the illustrated example of FIG. 3, the inductor L2 is disposed closer to the power amplifier 4B than the capacitor C2. By including the low pass filter 51, the matching circuit 5B is configured such that the impedance of the matching circuit 5B may appear to be infinite when viewed from the signal path T1 on the high-output side.

Similar to the matching circuit 5B, the matching circuit 5C may include the inductor L2 and the capacitor C2 instead of the series capacitor C1 and the shunt inductor L1.

Embodiment 2

A radio frequency module 1A and the communication device 100 according to the present embodiment will be described with reference to FIG. 4. In the radio frequency module 1 of Embodiment 1, exemplified is the circuit configuration in which a transmission signal is transmitted by frequency division duplex using a band select switch as the switch 7. In the radio frequency module 1A of the present embodiment, exemplified is a circuit configuration in which a transmission signal is transmitted by time division duplex (TDD) using a transmission/reception switch as a switch 27.

(1) Configuration of Communication Device

Figure 4:
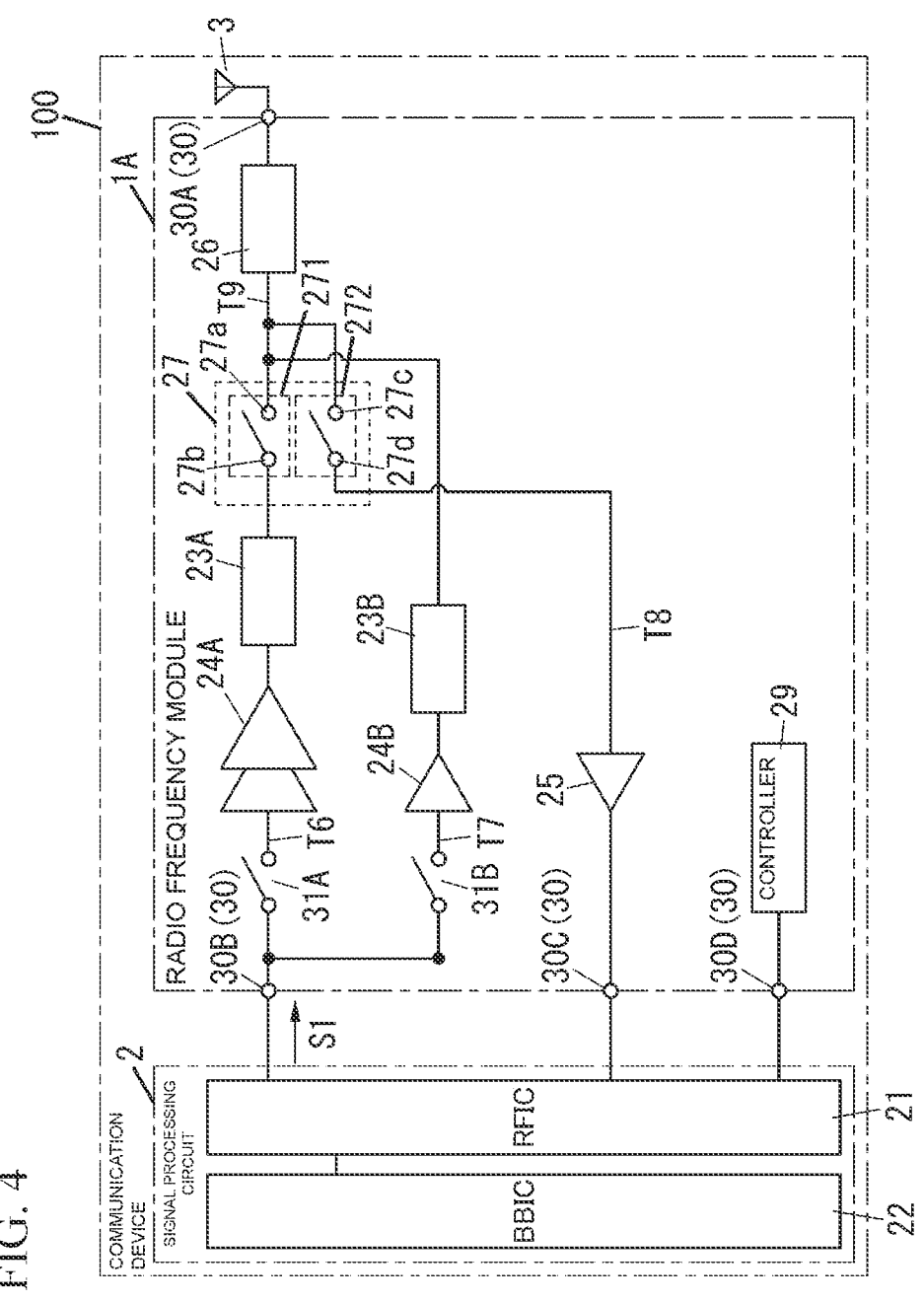
FIG. 4 is a block diagram of a radio frequency module and a communication device according to Embodiment 2.

As illustrated in FIG. 4, the communication device 100 according to the present embodiment includes the radio frequency module 1A, the signal processing circuit 2, and the antenna 3, similar to the communication device 100 according to Embodiment 1. Since the signal processing circuit 2 of the present embodiment has the same configuration as that of the signal processing circuit 2 of Embodiment 1, in the following description, the same configurations as those of the signal processing circuit 2 of Embodiment 1 are denoted by the same reference signs and a description thereof is omitted, and the configuration of the radio frequency module 1A of the present embodiment will mainly be described.

(2) Circuit Configuration of Radio Frequency Module

As illustrated in FIG. 4, the radio frequency module 1A transfers radio frequency signals (transmission signal and reception signal, for example) between the antenna 3 and the signal processing circuit 2.

The radio frequency module 1 includes multiple (two in the illustrated example) power amplifiers 24A and 24B, a low-noise amplifier 25, multiple (two in the illustrated example) matching circuits 23A and 23B, a transmission/reception filter 26, the switch 27, multiple (two in the illustrated example) switches 31A and 31B, a controller 29, and multiple outer connection terminals 30. Further, the radio frequency module 1A includes multiple (four in the illustrated example) signal paths T6 to T9.

The multiple outer connection terminals 30 include an antenna terminal 30A, a signal input terminal 30B, a signal output terminal 30C, and an input terminal 30D. The antenna terminal 30A is a terminal to which the antenna 3 is connected. The signal input terminal 30B is a terminal to which the transmission signal S1 from the signal processing circuit 2 is inputted, and is connected to the output portion of the signal processing circuit 2. The signal output terminal 30C is a terminal from which an output signal (reception signal) of the radio frequency module 1 is outputted, and is connected to an input portion of the signal processing circuit 2. The input terminal 30D is a terminal to which a control signal from the signal processing circuit 2 is inputted, and is connected to the output portion of the signal processing circuit 2.

The signal path T6 connects the signal input terminal 30B and a terminal 27b of the switch 27. The signal path T6 is provided with the switch 31A, the power amplifier 24A, and the matching circuit 23A. The signal path T9 connects terminals 27a and 27c of the switch 27 and the antenna terminal 30A. The signal path T9 is provided with the transmission/reception filter 26. The signal path T7 connects the signal input terminal 30B and a signal path (part of signal path T9) between the terminal 27a of the switch 27 and the transmission/reception filter 26. The signal path T7 is provided with the switch 31B, the power amplifier 24B, and the matching circuit 23B. The signal path T8 connects the signal output terminal 30C and a terminal 27d of the switch 27. The signal path T8 is provided with the low-noise amplifier 25.

The switches 31A and 31B are provided in the signal paths T6 and T7, respectively, and are changed over on and off by a control signal from the controller 29 to electrically connect and disconnect each of the signal paths T6 and T7. A signal path to be used for transmission or reception is selected from multiple signal paths T6 to T7 by using the switches 31A and 31B. Each of the switches 31A and 31B is a switch integrated circuit (IC), for example. Each of one end portions of the switches 31A and 31B is connected to the signal input terminal 30B, and the other end portions of the switches 31A and 31B are connected to respective input portions of the power amplifiers 24A and 24B.

The power amplifiers 24A and 24B are provided in the signal paths T6 and T7, respectively, and amplify transmission signals flowing through the signal paths T6 and T7. The power amplifier 24A has the first amplification factor as an amplification factor for amplifying the transmission signal S1. The power amplifier 24B has the second amplification factor smaller than the first amplification factor as an amplification factor for amplifying the transmission signal S1.

The power amplifiers 24A and 24B each has the input portion and the output portion. The input portions of the power amplifiers 24A and 24B are connected to end portions of the switches 31A and 31B, respectively, and output portions of the power amplifiers 24A and 24B are connected to input portions of the matching circuits 23A and 23B, respectively. The power amplifier 24A amplifies a transmission signal inputted to the input portion with the first amplification factor and outputs a first amplified signal from the output portion. The power amplifier 24B amplifies a transmission signal inputted to the input portion with the second amplification factor and outputs a second amplified signal from the output portion. Each of the power amplifiers 24A and 24B is controlled by a control signal from the controller 29. That is, in each of the power amplifiers 24A and 24B, a bias current is changed over on and off by the control signal from the controller 29.

The matching circuit 23A is a circuit for impedance matching of the power amplifier 24A and the switch 27, and is connected to a signal path (part of signal path T6) between the power amplifier 24A and the switch 27. The matching circuit 23B is a circuit for impedance matching of the power amplifier 24B and the transmission/reception filter 26, and is connected between the power amplifier 24B and the transmission/reception filter 26 by being provided in the signal path T7. In other words, the matching circuit 23B is connected between the output portion of the power amplifier 24B and the signal path (part of signal path T9) between the terminal 7a of the switch 7 and the transmission/reception filter 26. The matching circuit 23A is configured in the same manner as the matching circuit 5A of Embodiment 1. The matching circuit 23B is configured in the same manner as the matching circuit 5B of Embodiment 1. Accordingly, the matching circuit 23B is configured such that the impedance of the matching circuit 23B appears to be infinite when viewed from a side of the signal path T6 for a high-output mode. In other words, the matching circuit 23B is configured to allow the output signal (second amplified signal) outputted from the power amplifier 24B to pass through, but not to allow the output signal (first amplified signal) outputted from the power amplifier 24A to pass through.

The switch 27 is a switch (transmission/reception switch) for selecting a signal path to be used for transmission and reception from the three signal paths T6 to T8. The switch 27 is a switch IC, for example. The switch 27 has two sets of terminals (set of terminals 27a and 27b and set of terminals 27c and 27d). The terminals 27a and 27b of the first set are electrically connected to and disconnected from each other. The terminals 27c and 27d of the second set are electrically connected to and disconnected from each other. The terminal 27a (second terminal) and the terminal 27c are connected to the transmission/reception filter 26 by being connected to the signal path T9. The terminal 27b (first terminals) is connected to the output portion of the matching circuit 23A by being connected to the signal path T6. That is, the terminal 27b is connected to the output portion of the power amplifier 24A via the matching circuit 23A. The terminal 27d is connected to the input portion of the low-noise amplifier 25 by being connected to the signal path T8.

The switch 27 includes multiple (two in the illustrated example) internal switches 271 and 272. The internal switch 271 is a switch to change over selection and non-selection of the signal path T6 by changing over on and off. The internal switch 272 is a switch to change over selection and non-selection of the signal path T8 by changing over on and off. The internal switch 271 is configured of the terminals 27a and 27b, and changes over on and off with connection and disconnection of the terminals 27a and 27b. The internal switch 272 is configured of the terminals 27c and 27d, and changes over on and off with connection and disconnection of the terminals 27c and 27d.

The transmission/reception filter 26 is provided in the signal path T9. The transmission/reception filter 26 is a duplexer including a transmission filter and a reception filter, for example. The transmission filter is a filter whose pass band is a transmission band (communication band) of a first band, and the reception filter is a filter whose pass band is a reception band (communication band) of a second band. The transmission/reception filter 26 has a first input/output portion and a second input/output portion. The first input/output portion of the transmission/reception filter 26 is connected to the terminals 27a and 7c of the switch 27. The second input/output portion of the transmission/reception filter 26 is connected to the antenna terminal 30A. The transmission/reception filter 26 restricts a transmission signal inputted to the first input/output portion to a signal in a transmission band of a first communication band and outputs the signal from the second input/output portion. The transmission/reception filter 26 restricts a reception signal inputted to the second input/output portion to a signal in a reception band of a second communication band and outputs the signal from the first input/output portion.

The transmission/reception filter 26 is an acoustic wave filter, for example. The acoustic wave filter is a surface acoustic wave (SAW) filter using a surface acoustic wave, for example. Note that, the transmission/reception filter 26 is not limited to the SAW filter and may be a bulk acoustic wave (BAW) filter, for example, other than the SAW filter.

The controller 29 is a control device that controls the electronic components (power amplifiers 24A and 24B, matching circuits 23A and 23B, transmission/reception filter 26, switch 27, and switches 31A and 31B) in accordance with a control signal from the signal processing circuit 2. The controller 29 is electrically connected to the electronic components described above. Further, the controller 29 is connected to the output portion of the signal processing circuit 2 via the input terminal 30D. The controller 29 controls each of the electronic components described above in accordance with a control signal from the signal processing circuit 2 inputted to the input terminal 30D.

(2-1) Operation of Communication Device

The operation of the communication device 100 during transmission will be described with reference to FIG. 4.

The communication device 100 has the high-output mode and a low-output mode. The high-output mode is a mode in which the transmission signal S1 is amplified by the power amplifier 24A and transmitted. The low-output mode is a mode in which the transmission signal S1 is amplified by the power amplifier 24B and transmitted.

First, the operation in the high-output mode will be described. In the case above, the internal switch 271 is turned on and the internal switch 272 is turned off. With this, the signal path T6 for the high-output mode is selected from the two signal paths T6 and T7 for transmission. Further, the switch 31A is turned on, the switch 31B is turned off, a power supply of the power amplifier 24A is turned on, and a power supply of the power amplifier 24B is turned off.

In the state above, when the transmission signal S1 is inputted from the signal processing circuit 2 to the signal input terminal 30B, the transmission signal S1 flows through the signal path T6, the internal switch 271, and the signal path T9, and is transmitted from the antenna 3. At this time, the transmission signal S1 is processed in each of the power amplifier 24A and the matching circuit 23A, when flowing through the signal path T6, and is processed in the transmission/reception filter 26, when flowing through the signal path T9.

In the high-output mode, there may occur inflow of the transmission signal S1 flowing through the signal path T6 (signal path for high-output mode), from the signal path T6 to the signal path T7 (signal path for low-output mode) connected to the terminal 27*a* of the switch 27. However, the inflow above is suppressed by the matching circuit 23B provided in the signal path T7. More specifically, the matching circuit 23B is configured such that the impedance of the matching circuit 23B appears to be infinite when viewed from the side of the signal path T6 for the high-output mode. Thus, the inflow of the transmission signal S1 from the signal path T6 to the signal path T7 is suppressed by the matching circuit 23B.

Further, in the high-output mode, the power supply of the power amplifier 24B is turned off (that is, the bias current of the power amplifier 24B is turned off). With this, the impedance of the matching circuit 23B appears to be more infinite when viewed from the side of the signal path T6 for the high-output mode. As a result, the inflow of the transmission signal S1 from the signal path T6 to the signal path T7 is further suppressed by the matching circuit 23B.

Next, the operation in the low-output mode will be described. In the case above, both the internal switches 271 and 272 are turned off. Further, the switch 31B is turned on and the switch 31A is turned off. With this, the signal path T7 is selected from the two signal paths T6 and T7 that are for transmission. Further, the power supply of the power amplifier 24B is turned on, and the power supply of the power amplifier 24A is turned off.

In the state above, when the transmission signal S1 is inputted from the signal processing circuit 2 to the signal input terminal 30B, the transmission signal S1 flows through the signal paths T7 and T9, and is transmitted from the antenna 3. At this time, the transmission signal S1 is processed in each of the power amplifier 24B and the matching circuit 23B, when flowing through the signal path T7, and is processed in the transmission/reception filter 26, when flowing through the signal path T9.

In the low-output mode, when the transmission signal S1 flows through the signal paths T7 and T9, the transmission signal S1 does not pass through the switch 27, and thus, the loss caused by passing through the switch 27 does not occur. Therefore, in the low-output mode, the transmission signal S1 is transmitted from the antenna 3 with the loss in the switch 27 being suppressed.

Since the transmission signal S1 in the low-output mode is amplified by the power amplifier 24B, the electric power (power) of the transmission signal S1 is smaller than the electric power of the transmission signal S1 in the high-output mode. Therefore, as described above, it is effective to transmit the transmission signal S1 in the low-output mode with the loss in the switch 27 being suppressed.

As described above, in the communication device 100, there may be suppressed the loss of the transmission signal

S1 in the low-output mode, and further, there may also be suppressed a leak of the transmission signal S1 in the high-output mode from the signal path T6 for the high-output mode to the signal path T7 for the low-output mode.

Aspect

The following aspects are disclosed in the present description.

A radio frequency module (1; 1A) according to a first aspect includes a first power amplifier (4A; 24A), a second power amplifier (4B; 24B), a filter (6A; 26), a switch (7; 27), and a matching circuit (5B; 23B). The first power amplifier (4A; 24A) amplifies a first signal (S1) and outputs a first amplified signal. The second power amplifier (4B; 24B) amplifies a second signal (S1) with an amplification factor smaller than an amplification factor of the first power amplifier (4A; 24A) and outputs a second amplified signal. The filter (6A; 26) allows the first amplified signal and the second amplified signal to pass through. The switch (7; 27) has a first terminal (7*b*; 27*b*) and a second terminal (7*a*; 27*a*). The first terminal (7*b*; 27*b*) is connected to the output portion of the first power amplifier (4A; 24A). The second terminal (7*a*; 27*a*) is connected to the filter (6A; 26). The switches (7; 27) changes over connection and disconnection of the first terminal (7*b*; 27*b*) and the second terminal (7*a*; 27*a*). The matching circuit (5B; 23B) is connected between an output portion of the second power amplifier (4B; 24B) and the signal path between the second terminal (7*a*; 27*a*) of the switch (7; 27) and the filter (6A; 26).

With the use of the configuration above, a leak of a transmission signal (S1, first amplified signal) in a high-output mode into a signal path (T2; T7) for a low-output mode may be suppressed, and loss of the transmission signal (S1, second amplified signal) in the low-output mode may be suppressed.

In a radio frequency module (1; 1A) according to a second aspect, the matching circuit (5B; 23B) includes a high pass filter (50B), in the first aspect. The high pass filter (50B) is provided at a final stage among one or more processing stages, which process the second amplified signal of the second power amplifier (4B; 24B) and output the processed signal from the output portion, in the matching circuit (5B; 23B).

With the use of the configuration above, the impedance of the matching circuit (5B; 23B) may be made to appear to be infinite when viewed from a signal path (T1; T6) for the high-output mode. With this, the matching circuit (5B; 23B) may further suppress a leak of the transmission signal (S1) from the signal path (T1; T6) for the high-output to the signal path (T2; T7) for the low-output.

In a radio frequency module (1; 1A) according to a third aspect, the signal path is a first signal path, in the second aspect. In the radio frequency module (1; 1A), the matching circuit (5B; 23B) includes a capacitor (C1) and an inductor (L1). The capacitor (C1) is connected in series with the second power amplifier (4B; 24B) in a second signal path, which is different from the first signal path and is positioned between the output portion of the second power amplifier (4B; 24B) and the second terminal (7*a*; 27*a*) of the switch (7; 27). The inductor (L1) is connected between the second signal path and a ground.

With the use of the configuration above, a simple configuration may make the impedance of the matching circuit (5B; 23B) appear to be infinite when viewed from the signal path (T1) for the high-output mode.

In a radio frequency module (1; 1A) according to a fourth aspect, the signal path is a first signal path, in the second aspect. In the radio frequency module (1; 1A), the matching circuit (5B; 23B) includes an inductor (L2) and a capacitor (C2). The inductor (L2) is connected in series with the second power amplifier (4B; 24B) in a second signal path, which is different from the first signal path and is positioned between the output portion of the second power amplifier (4B; 24B) and the second terminal (7a; 27a) of the switch (7; 27). The capacitor (C2) is connected between the signal path and the ground.

With the use of the configuration above, a simple configuration may make the impedance of the matching circuit (5B; 23B) appear to be infinite when viewed from the side of the signal path (T1; T6) for the high-output mode.

In a radio frequency module (1; 1A) according to a fifth aspect, "+1" and "−1" of the real part (Re) of a reflection coefficient (Γ) corresponding to impedance (Z) of the matching circuit (5B; 23B) correspond to infinity and zero of the impedance (Z), respectively, in any one of the first to fourth aspects. In the case above, a phase angle (θ) representing the reflection coefficient (Γ) in polar coordinates has a value of −45 degrees or more and +45 degrees or less.

With the use of the configuration above, the impedance (Z) of the matching circuit (5B; 23B) may be made to appear to be infinite when viewed from the side of the signal path (T1; T6) for the high-output mode.

In a radio frequency module (1; 1A) according to a sixth aspect, "+1" and "−1" of the real part (Re) of the reflection coefficient (Γ) corresponding to the impedance (Z) of the matching circuit (5B; 23B) correspond to infinity and zero of the impedance (Z), respectively, in any one of the first to fifth aspects. In the case above, the real part (Re) of the reflection coefficient (Γ) has a value of 0.7 or more and 1 or less.

With the use of the configuration above, the impedance (Z) of the matching circuit (5B; 23B) may be made to appear to be infinite when viewed from the side of the signal path (T1; T6) for the high-output mode.

In a radio frequency module (1; 1A) according to a seventh aspect, a bias current of the second power amplifier (4B; 24B) is zero in a disconnection state of the switch (7; 27), in any one of the first to sixth aspects.

With the use of the configuration above, the impedance of the matching circuit (5B; 23B) may be made to appear to be more infinite when viewed from the side of the signal path (T1; T6) for the high-output mode.

In a radio frequency module (1; 1A) according to an eighth aspect, a cutoff frequency of a high pass filter (50) is lower than a frequency of the second amplified signal outputted from the second power amplifier (4B; 24B), in any one of the second to fourth aspects.

With the use of the configuration above, the matching circuit (5B; 23B) may effectively allow the second amplified signal of the second power amplifier (4B; 24B) to pass through.

In a radio frequency module (1; 1A) according to a ninth aspect, the switch (7; 27) is not provided in a signal path between the output portion of the second power amplifier (4B; 24B) and the filter (6A; 26), in any one of the first to eighth aspects.

With the use of the configuration above, it is possible to prevent the loss of the transmission signal (S1, second amplified signal) in the low-output mode from occurring in the switch (7; 27).

In a radio frequency module (1) according to a tenth aspect, the filter (6A) is defined as a first filter (6A), and the matching circuit (5B) is defined as a first matching circuit (5B), in any one of the first to ninth aspects. The radio frequency module (1) further includes a third power amplifier (4C), a second filter (6B), and a second matching circuit (5C). The third power amplifier (4C) amplifies a third signal (S1) with an amplification factor smaller than the amplification factor of the first power amplifier (4A; 24A) and outputs a third amplified signal. The second filter (6B) allows the first amplified signal and the third amplified signal to pass through. The switch (7) further includes a third terminal (7c) connected to the second filter (6B), and changes over connection and disconnection of the first terminal (7b) and the third terminal (7c). The second matching circuit (5C) is connected between an output portion of the third power amplifier (4C) and a signal path between the third terminal (7c) of the switch (7) and the second filter (6B).

With the use of the configuration above, it is possible to add another signal path (T3) in the low-output mode that outputs the third amplified signal of the third power amplifier (4C) to the second filter (6B) via the second matching circuit (5C). Then, in the case above as well, a leak of a transmission signal (S1, first amplified signal) in the high-output mode into another signal path (T3) for the low-output mode may be suppressed, and the loss of the transmission signal (S1, third amplified signal) in the low-output mode may be suppressed.

A communication device (100) according to an eleventh aspect includes the radio frequency module (1; 1A) according to any one of the first to tenth aspects, and a signal processing circuit (2). The signal processing circuit (2) is connected to the radio frequency module (1; 1A) and processes a radio frequency signal.

With the use of the configuration above, it is possible to provide the communication device (100) including the radio frequency module (1) having the effects described above.

REFERENCE SIGNS LIST 1, 1A Radio Frequency Module
2 Signal Processing Circuit
3, 3A, 3B Antenna
4A Power Amplifier (First Power Amplifier)
4B Power Amplifier (Second Power Amplifier)
4C Power Amplifier (Third Power Amplifier)
5A Matching Circuit
5B Matching Circuit (First Matching Circuit)
5C Matching Circuit (Second Matching Circuit)
6A Transmission Filter (Filter, First Filter)
6B Transmission Filter (Second Filter)
7 Switch
7a Terminal (Second Terminal)
7b, 7d Terminal (First Terminal)
7c Terminal (Third Terminal)
8A to 8C Switch
9 Controller
10 Outer Connection Terminal
10A, 10B Antenna Terminal
10C Signal Input Terminal
10D Input Terminal
21 RF Signal Processing Circuit
22 Baseband Signal Processing Circuit
23A, 23B Matching Circuit
24A Power Amplifier (First Power Amplifier)
24B Power Amplifier (Second Power Amplifier)
25 Low-Noise Amplifier
26 Transmission/Reception Filter 27 Switch
27a, 7a Terminal (Second Terminal)
27b, 7b Terminal (First Terminal)
27c Terminal
29 Controller
30 Outer Connection Terminal
30A Antenna Terminal
30B Signal Input Terminal
30C Signal Output Terminal
30D Input Terminal
31A, 31B Switch
50B, 50C High Pass Filter
51 Low Pass Filter
71, 72 Internal Switch
100 Communication Device
271, 272 Internal Switch
C1, C3 Series Capacitor
C2 Shunt Capacitor
E1, M1 Constant Resistance Circle
E2 Constant Reactance Circle
L1, L3 Shunt Inductor
L2 Series Inductor
S1 Transmission Signal (First To Third Signals)
T1 to T9 Signal Path
Z Impedance
Γ Reflection Coefficient
θ Phase Angle

The invention claimed is:

1. A radio frequency module, comprising:
a first power amplifier configured to amplify a first signal and to output a first amplified signal;
a second power amplifier configured to amplify a second signal with an amplification factor smaller than an amplification factor of the first power amplifier, and to output a second amplified signal;
a filter configured to pass the first amplified signal and the second amplified signal;
a switch having a first terminal connected to an output of the first power amplifier and a second terminal connected to the filter, and configured to change connection and disconnection of the first terminal and the second terminal; and
a matching circuit connected between an output of the second power amplifier and a first signal path, the first signal path being between the second terminal of the switch and the filter,
wherein the switch is not in a signal path between the output of the second power amplifier and the filter.

2. The radio frequency module according to claim 1, wherein the matching circuit comprises a plurality of stages configured to process the second amplified signal of the second power amplifier and to output a processed signal, and a high pass filter in a final stage of the plurality of stages.

3. The radio frequency module according to claim 2, wherein the matching circuit further comprises:
a capacitor connected in series with the second power amplifier in a second signal path, the second signal path being different from the first signal path and being between the output of the second power amplifier and the second terminal of the switch; and
an inductor connected between the second signal path and ground.

4. The radio frequency module according to claim 2, wherein the matching circuit further comprises:
an inductor connected in series with the second power amplifier in a second signal path, the second signal path being different from the first signal path and being between the output of the second power amplifier and the second terminal of the switch; and
a capacitor connected between the second signal path and ground.

5. The radio frequency module according to claim 2, wherein a cutoff frequency of the high pass filter is lower than a frequency of the second amplified signal outputted from the second power amplifier.

6. The radio frequency module according to claim 1, wherein when +1 and −1 of a real part of a reflection coefficient corresponding to impedance of the matching circuit respectively correspond to infinity and zero of the impedance, the real part of the reflection coefficient has a value of 0.7 or more and 1 or less.

7. The radio frequency module according to claim 1, wherein a bias current of the second power amplifier is zero in a disconnection state of the switch.

8. The radio frequency module according to claim 1, wherein when +1 and −1 of a real part of a reflection coefficient corresponding to impedance of the matching circuit respectively correspond to infinity and zero of the impedance, a phase angle representing the reflection coefficient in polar coordinates has a value of −45 degrees or more and +45 degrees or less.

9. A communication device, comprising:
the radio frequency module according to claim 1; and
a signal processing circuit connected to the radio frequency module and configured to process a radio frequency signal.

10. The radio frequency module according to claim 1, further comprising:
a third power amplifier configured to amplify a third signal with an amplification factor smaller than the amplification factor of the first power amplifier, and to output a third amplified signal;
a second filter configured to pass the first amplified signal and the third amplified signal; and
a second matching circuit,
wherein the switch further comprises a third terminal connected to the second filter and is further configured to change connection and disconnection of the first terminal and the third terminal, and
wherein the second matching circuit is connected between an output of the third power amplifier and a signal path between the third terminal of the switch and the second filter.

* * * * *